(12) United States Patent
Graf et al.

(10) Patent No.: US 10,514,409 B2
(45) Date of Patent: Dec. 24, 2019

(54) DEVICE AND METHOD FOR DETECTING A NUMBER OF ELECTROSTATIC DISCHARGES

(71) Applicant: Robert Bosch GmbH, Stuttgart (DE)

(72) Inventors: Michael Graf, Leutenbach (DE); Timo Seitzinger, Eningen (DE)

(73) Assignee: Robert Bosch GmbH, Stuttgart (DE)

( * ) Notice: Subject to any disclaimer, the term of this patent is extended or adjusted under 35 U.S.C. 154(b) by 110 days.

(21) Appl. No.: 15/573,512

(22) PCT Filed: May 9, 2016

(86) PCT No.: PCT/EP2016/060317
§ 371 (c)(1),
(2) Date: Jan. 12, 2018

(87) PCT Pub. No.: WO2016/180771
PCT Pub. Date: Nov. 17, 2016

(65) Prior Publication Data
US 2018/0143233 A1    May 24, 2018

(30) Foreign Application Priority Data

May 11, 2015   (DE) .......................... 10 2015 005862

(51) Int. Cl.
*G01R 31/00*    (2006.01)
*G01R 29/12*    (2006.01)
*H01L 27/02*    (2006.01)

(52) U.S. Cl.
CPC .......... *G01R 31/002* (2013.01); *G01R 29/12* (2013.01); *H01L 27/0251* (2013.01)

(58) Field of Classification Search
CPC ...... H01L 27/0248–0296; G01R 29/12; G01R 31/001; G01R 31/002; G01R 31/2851; G01R 31/2853
See application file for complete search history.

(56) References Cited

U.S. PATENT DOCUMENTS

| 5,903,220 | A | 5/1999 | Jon |
| 6,563,319 | B1 | 5/2003 | Kraz |
| 9,871,373 | B2 * | 1/2018 | O'Donnell ............... H02H 9/02 |
| 2008/0310059 | A1 * | 12/2008 | Wu ...................... G06F 17/5036 361/56 |
| 2009/0134880 | A1 * | 5/2009 | Grund .................. G01R 31/002 324/537 |
| 2009/0195946 | A1 * | 8/2009 | Kleveland ........... H01L 27/0251 361/56 |
| 2010/0271742 | A1 | 10/2010 | Shannon |

(Continued)

OTHER PUBLICATIONS

International Search Report for PCT/EP2016/060317 dated Jul. 21, 2016.

*Primary Examiner* — Huy Q Phan
*Assistant Examiner* — David B Frederiksen
(74) *Attorney, Agent, or Firm* — Norton Rose Fulbright US LLP; Gerard Messina

(57) ABSTRACT

A device for detecting a number of electrostatic discharges including a discharge protection unit, in which a detection unit is electrically connected in parallel to the discharge protection unit and the detection unit generates an output signal, which represents the number of electrostatic discharges. A related method is also described.

6 Claims, 7 Drawing Sheets

(56) References Cited

U.S. PATENT DOCUMENTS

| | | | |
|---|---|---|---|
| 2012/0081821 A1* | 4/2012 | Li | H02H 9/046 |
| | | | 361/56 |
| 2012/0092798 A1* | 4/2012 | Hwang | H01L 27/0259 |
| | | | 361/56 |
| 2014/0013296 A1* | 1/2014 | Hayashi | G06F 17/50 |
| | | | 716/136 |
| 2014/0285932 A1* | 9/2014 | Miyamoto | H02H 9/005 |
| | | | 361/56 |
| 2016/0104683 A1* | 4/2016 | Lin | H01L 27/0292 |
| | | | 257/532 |

* cited by examiner

DEVICE AND METHOD FOR DETECTING A NUMBER OF ELECTROSTATIC DISCHARGES

FIELD OF THE INVENTION

The present invention relates to a device and a method for detecting a number of electrostatic discharges.

BACKGROUND INFORMATION

Integrated circuits contain a variety of structures made of different materials. The sensitivity of the structures to stress rises sharply due to the structure sizes that are gradually becoming smaller.

Electrostatic discharges (ESD) in and/or through the chip are one type of stress. These arise due to charge separation and charge collection, if two surfaces of materials having different electron affinities touch. An electrostatic charge already arises if a small component slips from a machine or a package.

Such an electrostatic charge charges components up to several thousands of volts. Defects on components and structures in modern ASICs may already occur from >1 V depending on the technology.

Electrostatic discharges occur comparatively frequently. To nonetheless enable the manufacturing and/or the processing of the chips, structures are incorporated into ASICs, which clamp the voltage at the input of the IC.

So-called ESD clamps offer a low-ohmic path to the accumulated charge, in order to dissipate the charge carriers. The sensitive structures of the ASICs are thus protected from high voltages and currents.

Despite these ESD clamps, an electrostatic discharge means stress for an ASIC. ESD clamps are thus dimensioned as cost-effectively as possible, because they already require a comparatively large surface area when cost-effectively dimensioned, for example, depending on the strength of the ESD, up to 30% of the total circuit size. For this reason, some ESD structures only withstand a limited number of discharges and subsequently may no longer sufficiently protect the ASIC. Moreover, the ESD clamps are dimensioned in such a way that the ASIC is only protected from an overvoltage within the scope of its specification. An unexpectedly high voltage which is briefly applied to the ASIC may thus nonetheless destroy components.

The staff of the failure analysis department are often only left with the option of suspecting electrical overstress (EOS).

The document by F. Altolaguirre and M. Ker (2013), "Power-Rail ESD Clamp Circuit With Diode-String ESD Detection to Overcome the Gate Leakage Current in a 40-nm CMOS Process," *IEEE Transactions on Electron Devices*, vol. 60, issue 10, pp. 3500-3507, describes the recognition of an electrostatic discharge to be able to activate a discharge protection circuit in the event of a discharge having a lower startup current. A discharge protection circuit is actually connected in such a way that this special circuit operates more efficiently.

The document by M. Ker et al. (2010), "On-Chip ESD Detection Circuit for System-Level ESD Protection Design," *10th IEEE Conference on Solid-State and Integrated Circuit Technology ICSICT*, pp. 1584-1587, discusses an ESD event or a transient signal which is detected during operation, to bring the circuit of a TFT-LC display into a safe state.

The document by H. Sung et al. (2010), "Design of Toroidal Current Probe Embedded in Multilayer Printed Circuit Boards for Electrostatic Discharge ESD Detection," *IEEE Electrical Design of Advanced Package and Systems Symposium*, pp. 1-4, discusses that an ESD event may be detected with the aid of an integrated electrical coil. This is confirmed by a measurement using a current measuring clamp meter.

The document by W. Kuhn and R. Eatinger (2011), "BUILT-IN SELF-TEST IN INTEGRATED CIRCUITS—ESD EVENT MITIGATION AND DETECTION", Master's Thesis at Kansas State University 2011, discusses the detection of an ESD event or a transient signal during the operation by fusion of a type of fuse. This is because a thin line, which is destroyed under ESD stress, is connected in parallel to the ESD coupling diodes. This destruction is a stored piece of information. A function cannot be guaranteed under all conditions, however. The destruction may negatively affect the ASIC.

It may be disadvantageous that the method may not be reliable. It may detect a discharge, but not count it. The ASIC may thus be damaged. The detection is not reversible and a large surface area is required on the chip.

SUMMARY OF THE INVENTION

An object of the present invention is to reliably detect the number of the electrostatic discharges.

The device for detecting a number of electrostatic discharges includes a discharge protection unit. According to the present invention, a detection unit is electrically connected in parallel to the discharge unit. The detection unit generates an output signal, which represents the number of electrostatic discharges. In other words, a discharge protection unit is connected in parallel to the device for detecting a number of electrostatic discharges. The detection unit is exclusively operated by the energy of the electrostatic charge. It generates an output signal which represents the number of electrostatic discharges.

The advantage in this case is that the device enables reliable monitoring of the ESD protection, i.e., the discharge protection unit, without negatively affecting the ESD protection, for example, due to increased leakage current consumption, increased capacitance, or increased supply line resistance. A further advantage is that the additional surface area in comparison to a presently used ESD protection is less than 1%, because of the small structure sizes. The specified requirements for the ESD protection are not affected when there is appropriate selection of the ESD recognition.

In one refinement, the detection unit includes a power block, a logic unit, and a memory block. The power block, the logic unit, and the memory block are electrically connected in parallel to one another and the power block supplies the electronics logic unit and the memory block with voltage.

It is advantageous in this case that the device functions both in passive and in active operation of an ASIC.

In another embodiment, the power block includes a power-electronics circuit, which is configured to decouple and store energy of an electrostatic discharge pulse.

The advantage in this case is that the logic unit and the memory block are supplied with electrical current or electrical energy until the storage procedure is completed.

In one refinement, the power block includes a switch, which switches on the power-electronics circuit, the logic unit, and the memory block upon the occurrence of an electrostatic discharge. In other words, the switch may turn the detector load on or off.

It is advantageous in this case that the detector circuit does not cause any additional PIN leakage current in the operating range of the ASIC. The detector circuit may therefore be used independently of the PIN specification.

In another embodiment, the logic block unit is configured to detect the number of the electrostatic discharges.

The advantage in this case is that it may be ascertained how much stress the ASIC has already been subjected to, so that a more reliable statement may be made about the functional capability of the ASIC.

In one refinement, the logic unit is configured to recognize a snapback.

It is advantageous in this case that discharge protection structures which have a nonlinear behavior in the case of the dissipation of an ESD pulse may also be monitored by the detection circuit, i.e., sudden current drops may be detected.

Discharge protection structures having a nonlinear current-voltage curve usually require a substantially smaller surface area on the ASIC.

In another embodiment, the memory block is made of nonvolatile memory cells.

The advantage in this case is that the information about the number of the electrostatic discharges is retrievable at a later point in time.

The method according to the present invention for detecting a number of electrostatic discharges includes the detection of an energy of an electrostatic discharge with the aid of a power block, the evaluation of the energy of the electrostatic charge with the aid of the logic unit, a number of the electrostatic discharge being determined, the storage of the number of electrostatic discharges, and the generation of an output signal, which represents the number of the electrostatic discharges.

The advantage in this case is that the occurrences of electrostatic charges upon handling during the testing or during the installation in a control unit, and also during the operation of the ASIC are recorded. Therefore, influencing factors for ESD events may also be recognized and remedied, to prevent prior damage of chips during the manufacture. In other words, a significant advantage is that ESD is already recognized during the testing of the chips and after the installation of the chips in the control unit. This permits a flaw in the manufacture, the handling, or in the control unit to be inferred. This flaw may be more easily located and remedied by the detector. Therefore, disturbances are detected not only during operation, but rather also during the manufacture and assembly.

In one refinement, the output signal is detected and evaluated by a control unit of an ASIC and if a certain number of electrostatic discharges is exceeded, a signal is transmitted to a higher system level, the signal indicating that the ASIC will be damaged by further ESD events.

It is advantageous in this case that the service life of the ASIC is determinable more precisely and components may be replaced before the protective structure fails.

Further advantages result from the following description of exemplary embodiments and from the dependent patent claims.

The present invention will be explained hereafter on the basis of the specific embodiments and the appended drawings.

DETAILED DESCRIPTION

Figure 1:
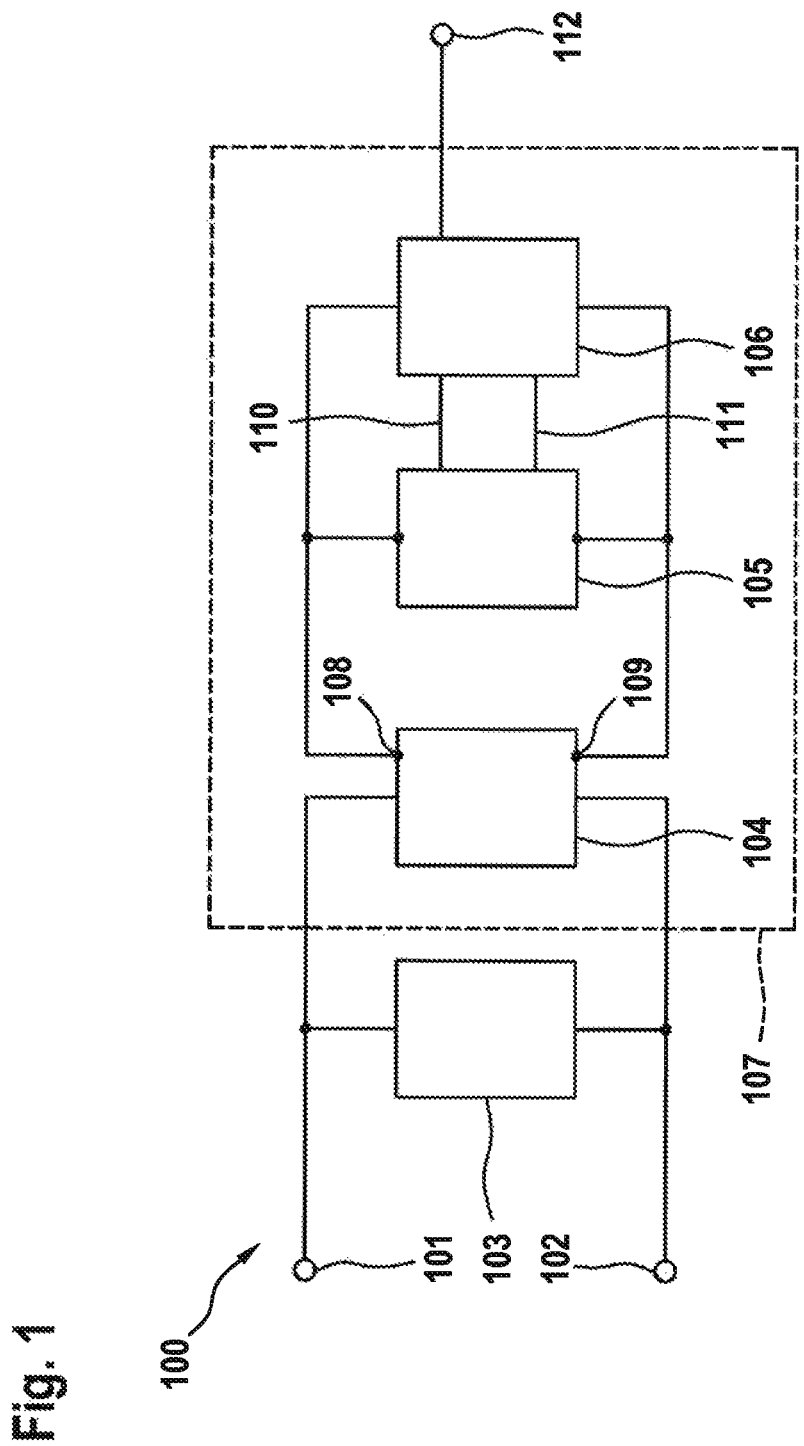
FIG. 1 shows a device for detecting a number of electrostatic discharges.

FIG. 1 shows a device 100 for detecting a number of electrostatic discharges. Device 100 includes a first terminal 101, a second terminal 102, and an output 112. First terminal 101 represents an input and second terminal 102 represents the ground terminal of a discharge protection unit 103. First terminal 101 and second terminal 102 are electrically conductively connected to discharge protection unit 103, the so-called ESD protection. A detection unit 107, which includes a power block 104, a logic unit 105, and a memory block 106, is situated electrically in parallel to discharge protection unit 103. In other words, device 100 includes three blocks, a first block, so-called power block 104, the second block, so-called logic unit 105, and the third block, so-called memory block 106. Power block 104 includes a first output 108 and a second output 109. First output 108 of power block 104 represents a first voltage potential and second output 109 of power block 104 represents a second voltage potential, usually ground. First output 108 of power block 104 and second output 109 of power block 104 are each electrically conductively connected to logic unit 105 and memory unit 106, logic unit 105 and memory unit 106 being situated electrically in parallel to power block 104. In other words, the power block is used to supply logic unit 105 and memory block 106 with electrical current, so that the detection may be carried out as desired. Logic unit 105 includes a first output 110 and a second output 111, which are electrically conductively connected to memory block 106. First output 110 of logic unit 105 generates a programming signal and second output 111 of logic unit 105 generates a signal which reflects the memory state of the corresponding memory cell. In the case of a number of memory cells greater than 1, multiple lines of type 111 are required.

In one modification, the proposed circuit may be expanded to also make the strength of the ESD event measurable. In the event of an error, the error analysis is greatly facilitated, because conclusions may be drawn about component stress.

Figure 2A:
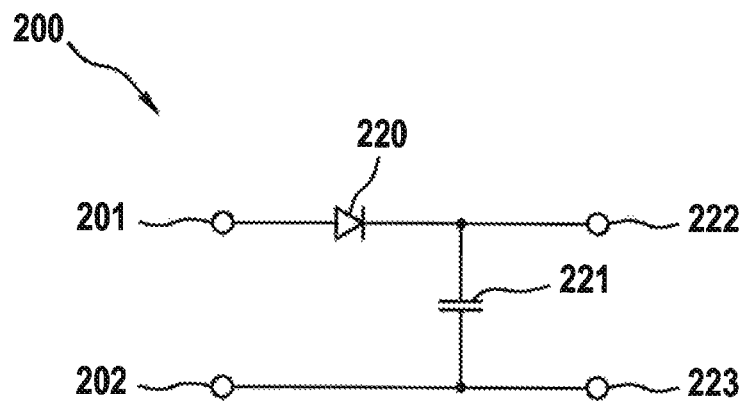
FIG. 2a shows a first exemplary embodiment of a power block.

FIG. 2a shows a first exemplary embodiment of the power block. The power block is made of a power-electronics circuit 200, which includes a first diode 220 and a first capacitor 221. The power block includes four terminals 201, 202, 222, and 223. First diode 220 is connected on the input side to first terminal 201 of the discharge protection unit. Capacitor 221 is situated between terminals 222 and 223. First diode 220 conducts an ESD charge from the central ESD clamp into first capacitor 221. The charge is stored therein, to thus supply the logic unit and the memory block. The power block is usable for both positive and negative ESD protection. The power block has to be adapted to the corresponding discharge protection. In the case of a bidirectional ESD protection circuit, only one discharge direction may be detected.

Figure 2B:
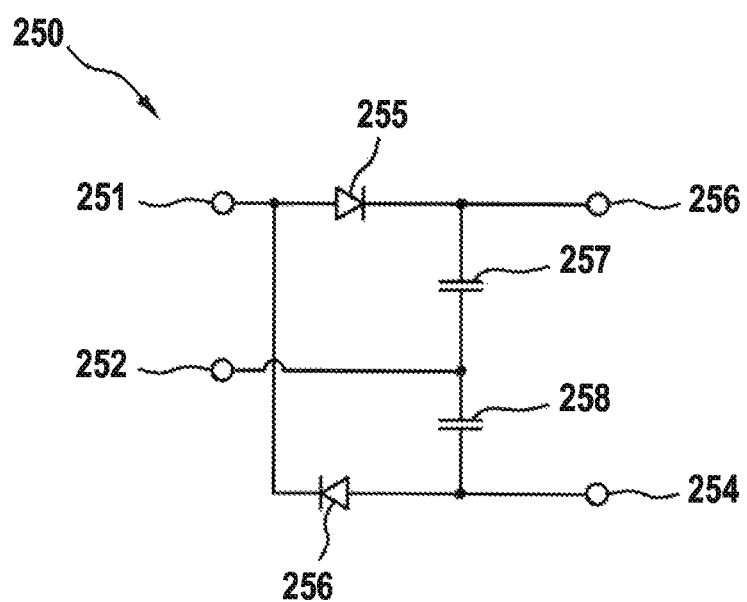
FIG. 2b shows a second exemplary embodiment of the power block.

FIG. 2b shows a second exemplary embodiment of a power block. The power block is made of a power-electronics circuit 250, which includes a first diode 255, a second diode 256, a first capacitor 257, and a second capacitor 258. The power block includes four terminals 251, 252, 253, and 254. First diode 255 dissipates the current in the event of a positive discharge and second diode 256 dissipates the current for a negative discharge from the central clamp, i.e., terminals 251 and 252. Capacitors 257 and 258 are charged using the current. The logic unit and the memory block are supplied with electrical energy via capacitors 257 and 258. This circuit functions without an adaptation in a discharge protection unit for positive and for negative discharges. In the case of a bidirectional discharge protection unit, positive and negative discharges may be detected using this circuit in the power block.

Figure 3:
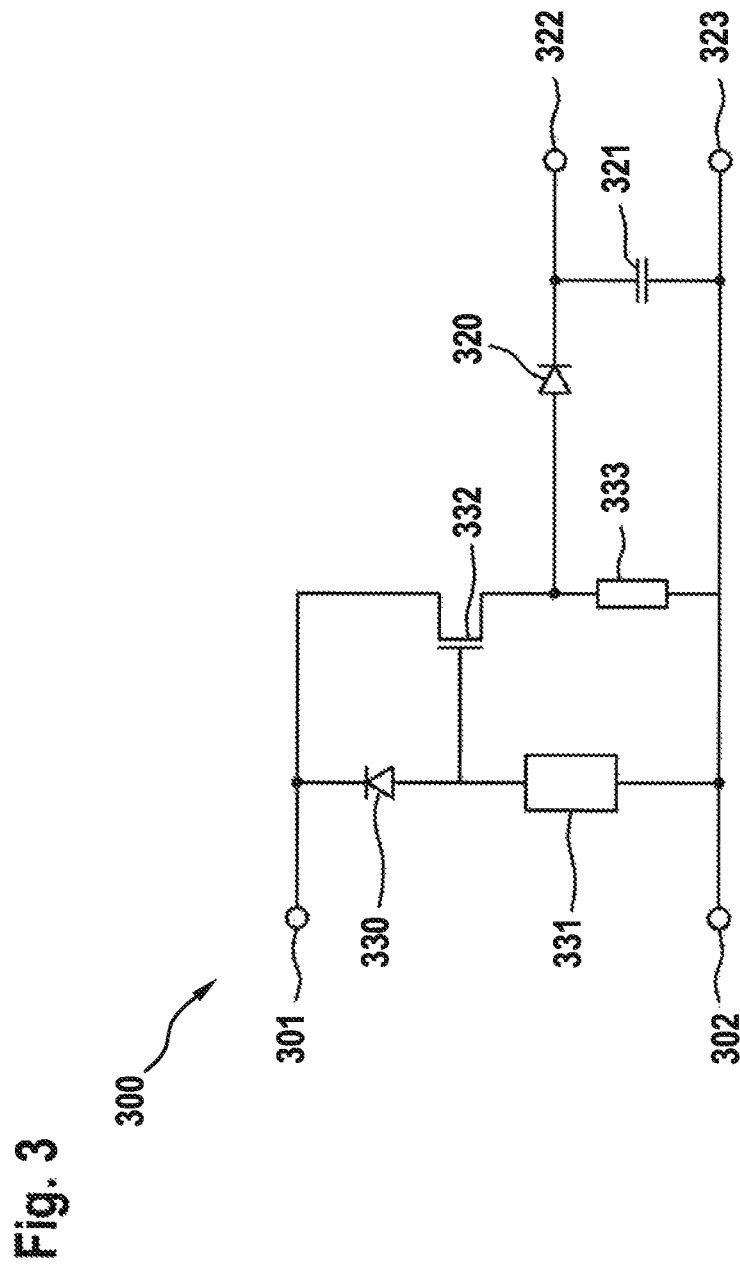
FIG. 3 shows a third exemplary embodiment of the power block.

FIG. 3 shows a third exemplary embodiment of the power block. The power block includes an expansion of the circuit from FIG. 1, so that the power block is only turned on in case of ESD, whereby the ASIC to be protected is not loaded by an additional PIN leakage current. First diode 320 and first capacitor 321 represent the power-electronics circuit as in FIG. 1, to supply the logic unit and the memory block with energy. The expansion of the circuit includes a further diode 330 and a resistor 331 and a further resistor 333. Further diode 330 and resistor 331 are used to turn on a MOSFET 332 in case of an ESD event. Further resistor 333 is required to be able to turn off MOSFET 332 again after the ESD discharge. Current is coupled in the event of an ESD discharge via the barrier layer of further diode 330. This current causes a voltage across resistor 331. This voltage switches on MOSFET 332. After a time settable via resistor 331 and via further resistor 333, or after capacitor 321 is charged, MOSFET 332 turns off again. MOSFET 332 may be replaced by another switch, for example, a thyristor. Its conductivity also remains high in the case of a charged capacitor 321, until the decay of the ESD pulse. The size of capacitor 321 may be substantially reduced in this way.

Figure 4:
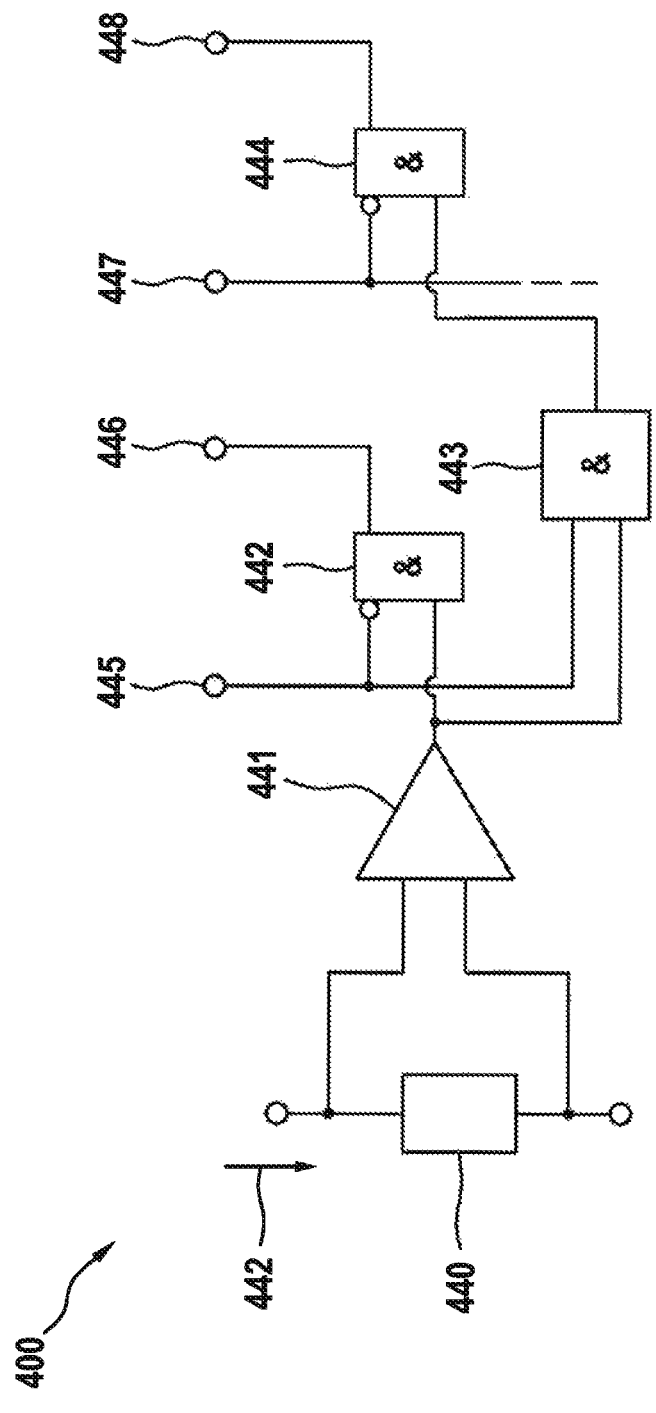
FIG. 4 shows a logic unit for ESD current recognition and for incremental writing of the OTP cells.

FIG. 4 shows a logic unit 400 for ESD current recognition and for incremental writing of one-time programmable fixed value memory cells, so-called OTP cells. OTP means that the programming state of OTP cells may no longer be electrically changed after they have been programmed. There are various types of OTP cells. They are programmed either via a current flowing through the cell or via a voltage applied to a cell. The latter represents the more suitable cell because of the limited charge available. Logic unit 400 includes a resistor 440, which functions as a shunt resistor. A voltage drops via the resistor in case of ESD due to a flowing ESD current 442. Logic unit 400 additionally includes an operational amplifier 441, which detects current 442. If current 442 is detected, the output of operational amplifier 441 switches to logical high. Depicted logic gates 442, 443, and 444 enable memory signals to be generated for memory cells of the memory block. A terminal 445 is configured to represent the programming signal for a first memory cell. In other words, terminal 445 is configured to indicate whether the first memory cell is programmed or is not programmed. Terminal 445 may only include or become logical high if the first memory cell is written with a logical 1. A low signal at terminal 445 prompts logic gate 442 to have first memory cell written with logical 1, if comparator 441 recognizes an ESD event. For this purpose, the output of gate 446 becomes logical "high." In the event of a second ESD detection, a second memory cell is written. Terminal 445 now indicates that the first memory cell is written. For the detection of the second ESD discharge, the part of the logic is used which includes terminal 447, further terminal 448, and logic gate 444, and logic gate 443. Logical high at output 449 of logic gate 443 indicates in this case that a second ESD event has occurred or has happened and the first memory cell is written. Terminal 447 indicates the state of the second memory cell. The second memory cell is written via output 448. Logic unit 400 is not limited to the number of the logic gates shown.

In other words, the logic unit is required to determine that or how many ESD discharges have taken place. Energy supplied by the power block alone is not sufficient to detect an ESD discharge, since presently used circuits often have flank slopes in the range of the rising time of an ESD event. A startup or a current conduction of the ESD clamp therefore has to be detected. The memory cells are only necessary if the detection is also to take place passively, without function of the ASIC. This analog measured signal is digitized and transferred during operation of the ASIC to the higher-order computer unit. Depending on the type of the detection, the logic unit is made up of one or multiple operational amplifiers or comparators, and also logic gates which supply signals to the memory unit or receive input signals from the memory unit, to be able to add up the actual number of ESD events.

Figure 5:
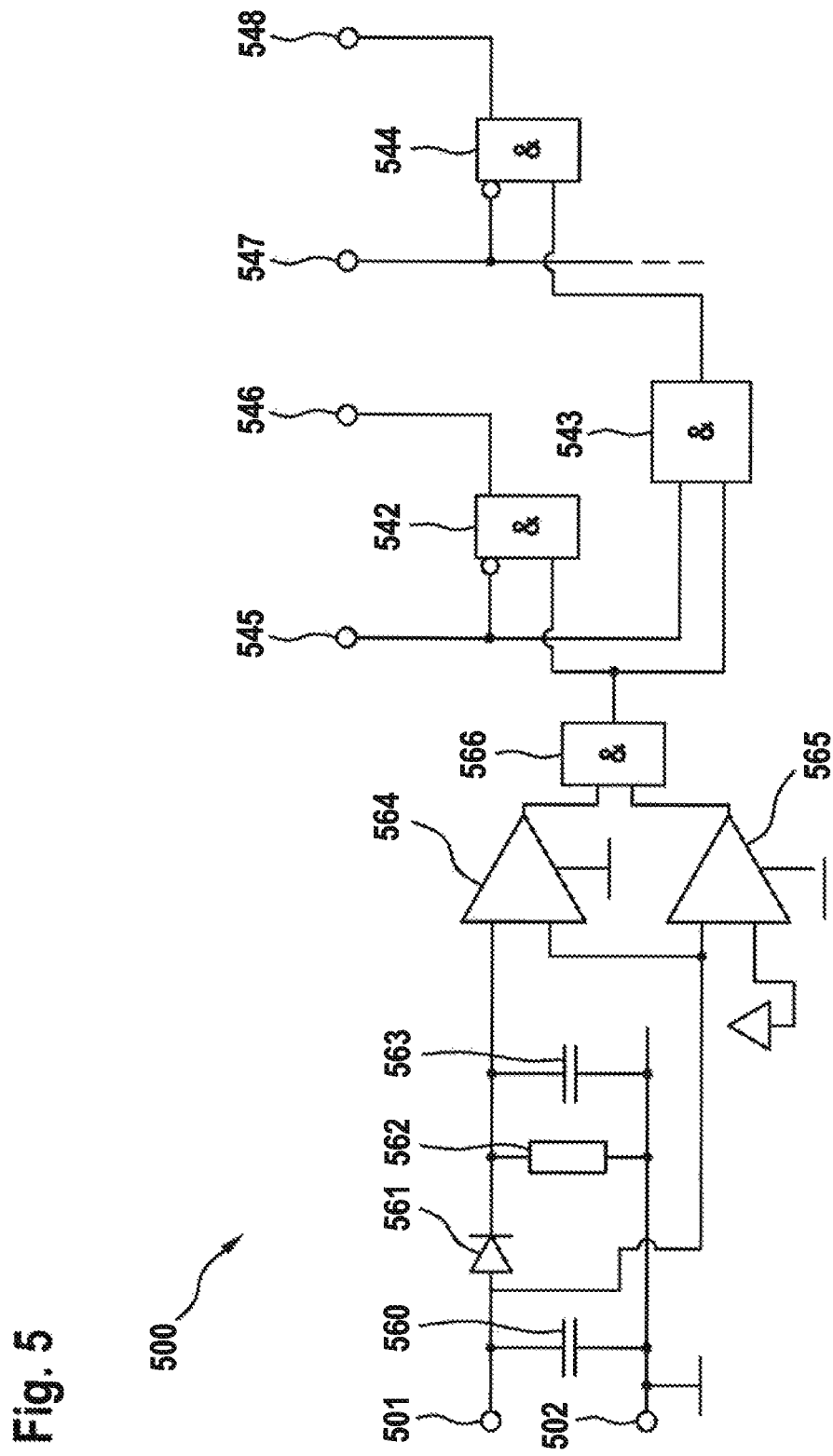
FIG. 5 shows a logic unit for ESD recognition by the detection of a snapback of the ESD protection circuit.

FIG. 5 shows a logic unit of an ESD recognition circuit. It is capable of recognizing an ESD on the basis of the noncontinuous current-voltage characteristic curve (snapback) of an ESD protection circuit with snapback. It is no longer necessary to measure the ESD current. FIG. 5 is an expansion of the circuit from FIG. 4 for this purpose. FIG. 5 includes, instead of the current recognition using resistor 440 and operational amplifier 441, a further capacitor 560, a further diode 561, a further resistor 562, and an additional capacitor 563. With the aid of the expansion, it may be checked whether there has been a so-called snapback of the ESD protection circuit. A snapback refers to a property of an ESD clamp. In the event of an ESD discharge, the voltage initially rises until the ESD current has reached a certain dimension. The resistance across the ESD clamp then drops suddenly. In the case of an equal ESD current, the voltage across the ESD clamp also drops strongly. If the voltage across the ESD clamp rises, capacitors 560 and 563 charge to a high voltage. If the voltage across the ESD clamp snaps back, capacitor 560 discharges. Diode 561 ensures that capacitor 563 does not also discharge. Resistor 562 is to safely discharge additional capacitor 563 after an ESD event. The two comparators 564 and 565 evaluate the voltage across capacitors 560 and 563 and relay the detection via a logical signal to the logic unit. The logic gates are identical to FIG. 4.

Figure 6:
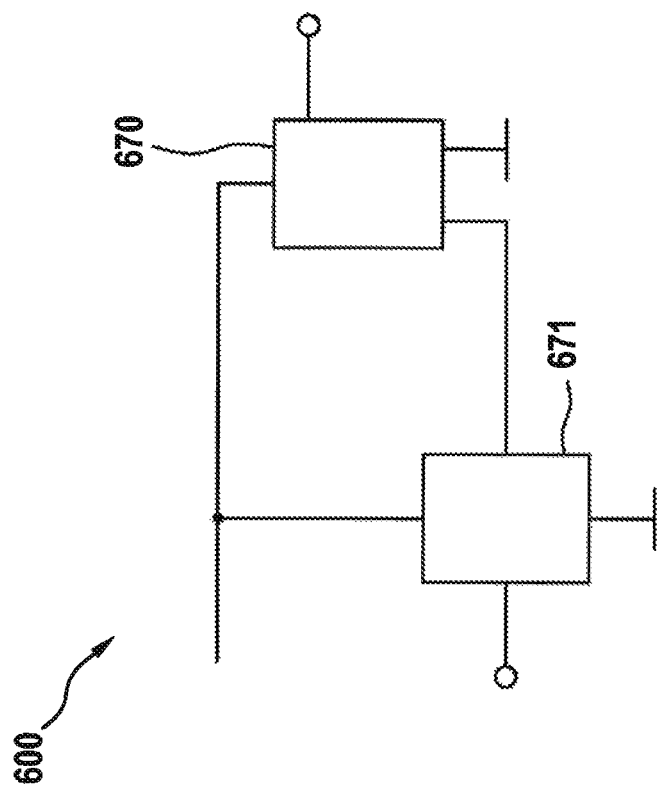
FIG. 6 shows a memory block.

FIG. 6 describes a memory block 600, which is made up of nonvolatile memory cells 670 and a memory logic 671. Memory logic 671 is necessary to write the memory cells. The memory block provides the stored pieces of information to the logic block, and a higher-order computer unit. The memory block receives the signals to be stored from the logic unit. In the simplest case, each memory cell of the memory block receives one signal line, which—when it becomes logical one—prompts the memory cell to store the logical 1. In addition, the memory logic block has one connection to the logic block per memory cell. The circuit may count arbitrarily high if the memory unit is expanded arbitrarily.

Figure 7:
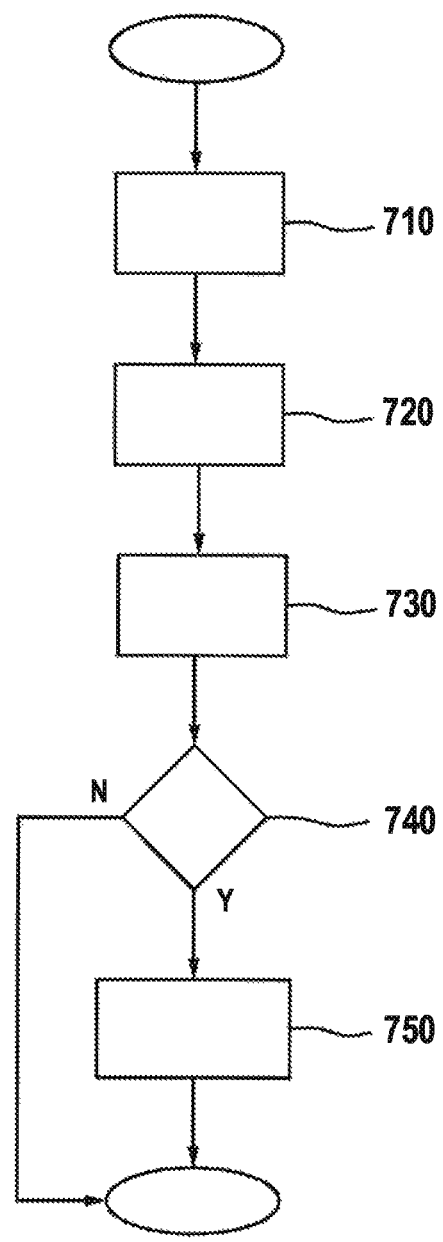
FIG. 7 shows a flow chart of a method for detecting a number of electrostatic discharges.

FIG. 7 shows the sequence of a method for detecting a number of electrostatic discharges. Method 700 starts with step 710, in which energy of an electrostatic discharge is detected with the aid of a power block. In a following step 720, the energy of the electrostatic charge is evaluated with the aid of the logic unit, a number of the electrostatic discharges being determined.

In a following step 730, the number of electrostatic discharges is stored. In a following step 740, it is checked whether the ASIC is active. If this is the case, in a following step 750, an output signal is generated which represents the number of the electrostatic discharges. If the ASIC is not active, the method is thus directly terminated. In other words, since the circuit also operates passively, block step 740 is only carried out when the ASIC is active and in operation.

In one exemplary embodiment, the information of an ESD event may be evaluated during operation and used as useful information to increase the safety during operation. This is particularly important, since ESD events may cause transmission errors or may corrupt safety-critical pieces of information, which have to be provided in real time.

Moreover, from a specific number of ESD events, it may be reported to higher system levels that the component will be damaged by further ESD events. As a result, components may be replaced before the protection structure fails or process steps during the installation of the components may be improved.

In other words, in addition to the monitoring of ESD events, this fundamentally relates to the estimation of the electrical stress to which a component was subjected and the increase of the safety of circuits.

What is claimed is:

1. A device for detecting a number of electrostatic discharges, comprising:
    a discharge protection unit;
    wherein a detection unit is electrically connected in parallel to the discharge protection unit, and wherein the detection unit is configured to generate an output signal which represents the number of electrostatic discharges,
    wherein the detection unit includes a power block, a logic unit, and a memory block, wherein the power block, the logic unit, and the memory block are electrically connected in parallel to one another, and the power block is configured to supply the logic unit and the memory block with voltage,
    wherein the power block includes a power-electronics circuit, which is configured to decouple and store energy of an electrostatic discharge pulse,
    wherein the power block includes a switch, which switches on the power-electronics circuit, the logic unit, and the memory block upon the occurrence of an electrostatic discharge.

2. The device of claim 1, wherein the logic unit is configured to detect the number of the electrostatic discharges.

3. The device of claim 1, wherein the logic unit is configured to recognize a snapback.

4. The device of claim 1, wherein the memory block includes nonvolatile memory cells.

5. A method for detecting a number of electrostatic discharges, the method comprising:
    detecting an energy of an electrostatic discharge with a power block;
    evaluating the energy of the electrostatic charge with the logic unit, wherein a number of the electrostatic discharges is determined;
    storing the number of electrostatic discharges; and
    generating an output signal, which represents the number of the electrostatic discharges,
    wherein the detection unit includes the power block, a logic unit, and a memory block, wherein the power block, the logic unit, and the memory block are electrically connected in parallel to one another, and the power block is configured to supply the logic unit and the memory block with voltage,
    wherein the power block includes a power-electronics circuit, which is configured to decouple and store energy of an electrostatic discharge pulse,
    wherein the power block includes a switch, which switches on the power-electronics circuit, the logic unit, and the memory block upon the occurrence of an electrostatic discharge.

6. The method of claim 5, wherein the output signal is detected by a control unit of an ASIC (application-specific integrated circuit), the output signal is evaluated, and if a certain number of electrostatic discharges is exceeded, a signal is transmitted to a higher system level, which indicates that the ASIC will be damaged by further ESD (electrostatic discharge) events.

* * * * *